United States Patent
Fallah et al.

(10) Patent No.: US 7,400,175 B2
(45) Date of Patent: Jul. 15, 2008

(54) RECYCLING CHARGE TO REDUCE ENERGY CONSUMPTION DURING MODE TRANSITION IN MULTITHRESHOLD COMPLEMENTARY METAL-OXIDE-SEMICONDUCTOR (MTCMOS) CIRCUITS

(75) Inventors: Farzan Fallah, San Jose, CA (US); Ehsan Pakbaznia, Los Angeles, CA (US); Massoud Pedram, Beverly Hills, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/755,354

(22) Filed: May 30, 2007

(65) Prior Publication Data

US 2007/0279100 A1    Dec. 6, 2007

Related U.S. Application Data

(60) Provisional application No. 60/803,583, filed on May 31, 2006.

(51) Int. Cl.
  *H03K 19/00* (2006.01)
(52) U.S. Cl. .............................. 326/93; 326/98; 326/34
(58) Field of Classification Search .................. 326/26, 326/27, 33, 34, 46, 82, 93–98, 112, 119, 326/121
  See application file for complete search history.

(56) References Cited

U.S. PATENT DOCUMENTS 7,042,245 B2* 5/2006 Hidaka ........................ 326/34

2002/0158665 A1* 10/2002 Ye et al. ........................ 326/83
2006/0002223 A1* 1/2006 Song et al. .................. 365/226
2006/0145726 A1* 7/2006 Hidaka ........................ 326/98

OTHER PUBLICATIONS

Abdollahi et al., "An Effective Power Mode Transition Technique in MTCMOS Circuits," *Proc. DAC*, Anaheim, California, 6 pages, Jun. 13-17, 2005.
Anis et al., "Dynamic and Leakage Power Reduction in MTCMOS Circuits Using an Automated Efficient Gate Clustering Technique," in *Proc. of Design and Automation Conference*, pp. 480-485, 2002.
Elmore, "The Transient Response of Damped Linear Networks with Particular Regard to Wideband Amplifiers", *J. Applied Physics*, Journal of Applied Physics, vol. 19, pp. 55-63, Jan. 1948, Received Apr. 11, 1947.
Heydari et al., "Ground Bounce in Digital VLSI Circuits," *IEEE Trans. on VLSI systems*, pp. 1-15, Apr. 2003.
Kao et al., "Subthreshold Leakage Modeling and Reduction Techniques," *Proc. Int. Conf. Computer-Aided Design*, Nov. 2002, 8 pages.

(Continued)

*Primary Examiner*—Don P Le
(74) *Attorney, Agent, or Firm*—Baker Botts L.L.P.

(57) ABSTRACT

In one embodiment, a circuit includes a first circuit block connected to ground via a first sleep transistor, a virtual ground node between the first circuit block and the first sleep transistor, a second circuit block connected to a supply via a second sleep transistor, and a virtual supply node between the second circuit block and the second sleep transistor. The circuit also includes a transmission gate (TG) or a pass transistor connecting the virtual ground node to the virtual supply node to enable charge recycling between the first circuit block and the second circuit block during transitions by the circuit between active mode and sleep mode.

18 Claims, 4 Drawing Sheets

OTHER PUBLICATIONS

Kao et al., "Transistor Sizing Issues and Tool for Multi-Threshold CMOS Technology," *Proc. of Design and Automation Conf.*, pp. 409-414, 1997.

Kao et al., "MTCMOS Hierarchical Sizing Based on Mutual Exclusive Discharge Patterns," in *Proc. of DAC*, pp. 495-500, 1998.

Kim et al., "Experimental Measurement of a Novel Power Gating Structure with Intermediate Power Saving Mode," *Proc. of ISLPED*, pp. 20-25, Aug. 9-11, 2004, Newport Beach, California.

Kim et al., "Understanding and Minimizing Ground Bounce During Mode Transition of Power Gating Structures," *Proc. of Intl. Symp. on Low Power Electronics and Design*, pp. 22-25, 2003.

Liu et al., "Charge Recycling Between Virtual Power and Ground Lines for Low Energy MTCMOS,", *Proc. of Intl. Symp. on Quality Electronic Design*, 6 pages, 2007.

Pakbaznia et al., "Charge Recycling in MTCMOS Circuits: Concept and Analysis," Under Review for *Design Automation Conference*, 6 pages, 2006.

Ratzlaff et al., "RICE: Rapid Interconnect Circuit Evaluator," *Proc. of Design Automation Conference*, 8 pages, 1991, printed Jun. 7, 2007.

Sakurai et al., "Alpha-Power Law MOSFET Model and its Applications to CMOS Inverter Delay and Other Formulas," *IEEE J. Solid-State Circuits*, vol. 25, pp. 584-594, Apr. 1990.

Tutuianu et al., "An Explicit RC-Circuit Delay Approximation Based on First Three Moments of Impluse Response", *Proc. of Design Automation Conference*, pp. 611-616, 1996.

* cited by examiner

US 7,400,175 B2

RECYCLING CHARGE TO REDUCE ENERGY CONSUMPTION DURING MODE TRANSITION IN MULTITHRESHOLD COMPLEMENTARY METAL-OXIDE-SEMICONDUCTOR (MTCMOS) CIRCUITS

RELATED APPLICATION

This Application claims the benefit, under 35 U.S.C. §119 (e), of Provisional Patent Application No. 60/803,583, filed 31 May 2006.

TECHNICAL FIELD

The present disclosure relates generally to circuit design.

BACKGROUND

Designing an energy-efficient power-gating structure is an important aspect of the design of Multithreshold Complementary Metal-Oxide-Semiconductor (MTCMOS) circuit. Typically, an MTCMOS circuit consumes a large amount of energy during mode transitions.

DESCRIPTION OF EXAMPLE EMBODIMENTS

Figure 1:
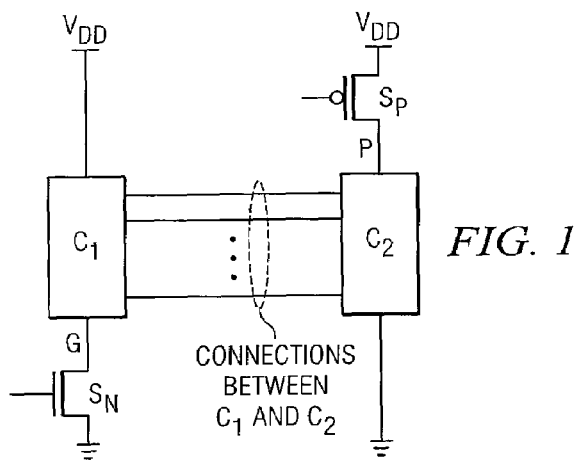
FIG. 1 illustrates an example power-gating structure.

As Complementary Metal-Oxide-Semiconductor (CMOS) technology scales down, the supply voltage is reduced to avoid device failure due to high electric fields in the gate oxide and the conducting channel under the gate. Voltage scaling reduces the circuit power consumption because of the quadratic relationship between dynamic power consumption and supply voltage, but it also increases the delay of logic gates. To compensate for the resulting performance loss, transistor threshold voltages are decreased, which causes exponential increase in the sub-threshold leakage current.

MTCMOS technology provides low leakage and high performance operation by utilizing high speed, low Vt (LVT) transistors for logic cells and low leakage, high Vt (HVT) devices as sleep transistors. Sleep transistors disconnect logic cells from the supply or ground to reduce the leakage in the sleep mode. In this technology, also called power gating, wake-up latency and power plane integrity are important issues.

Assume a sleep/wake-up signal is supplied by an on-chip power management module. An important question is how to reduce energy consumption during mode transition, i.e., when switching from active mode to sleep mode, or vice versa. Another important question is how to reduce the time required to turn on the circuit upon receiving the wake-up signal, since the length of the wake-up time can affect the overall performance of a very large scale integration (VLSI) circuit. Furthermore, the large current flowing to ground when sleep transistors are turned on can become a major source of noise in the power distribution network, which can adversely impact the performance or functionality of other parts of the circuit. Hence, there is often a trade-off between the generated noise due to the current flowing to ground and the transition time from the sleep mode to the active mode.

Sleep transistors cause logic cells to slow down during the active mode of circuit operation. This is due to the voltage drop across the functionally redundant sleep transistors and the increase in the threshold voltage of logic cell transistors as a result of the body effect. The performance penalty of a sleep transistor depends on its size and the amount of current that goes through it. Several methods have been proposed for optimal sizing of sleep transistors in a given circuit to meet a performance constraint. In one such proposal, a power-gating structure supports an intermediate power-saving mode and a traditional power cut-off mode. The idea is to add a p-channel metal-oxide-semiconductor (PMOS) transistor in parallel with each n-channel metal-oxide-semiconductor (NMOS) sleep transistor. By applying zero voltage to the gate of the PMOS transistor, the circuit can be put in the intermediate power saving mode, realizing both leakage reduction and data retention. Furthermore, transitioning through the intermediate mode while changing between sleep and active modes reduces the magnitude of supply-voltage fluctuations during power-mode transitions. In the cut-off mode, the gate of the PMOS transistor is connected to $V_{DD}$.

However, none of these methods attempts to reduce power consumption during sleep-to-active and active-to-sleep transitions or reduce wake-up time and the noise generated by the power-gating structure. In contrast, particular embodiments apply a charge-recycling technique to reduce power consumption during mode transition in a power-gating structure while maintaining (or perhaps even improving) wake-up time. Particular embodiments also help reduce GB during sleep-to-active transitions. Particular embodiments apply a charge-recycling technique to reduce power consumption during mode transition in a power-gated structure in presence of virtual ground and virtual power resistor-capacitor (RC) networks for standard cell design circuits. Particular embodiments utilize one or more algorithms to determine placement and sizing for sleep transistors and charge-recycling TGs.

FIG. 1 illustrates an example power-gating structure. There are two different blocks in the circuit; one is power-gated by an NMOS sleep transistor that connects the virtual ground (Node G in FIG. 1) to ground, whereas the other is power-gated by a PMOS sleep transistor that connects the virtual supply (Node P in FIG. 1) to supply. During the active period, sleep transistors $S_N$ and $S_P$ are in the linear region and the voltage values of the virtual ground and virtual supply are equal to zero and $V_{DD}$, respectively. During the sleep period, sleep transistors $S_N$ and $S_P$ are turned off and, since they are chosen to be high threshold devices, they allow little sub-threshold leakage current to flow through them.

If the duration of the sleep period is sufficiently long, all the internal nodes of the gates in block $C_1$ and Node G will charge up to a high voltage, possibly close to $V_{DD}$. This is due to Node G being floated and leakage current causing its voltage level to rise toward $V_{DD}$. Similarly, if the duration of the sleep period is long enough, all the internal nodes of $C_2$ and Node P will discharge down to a low voltage, possibly close to zero.

Next, consider whether the assumption that node G is charged to $V_{DD}$ in the sleep mode is valid. Consider sub-circuit $C_1$ in FIG. 1. The only case where this assumption is invalid is when outputs of all logic cells in $C_1$ are set to logic 1 (i.e., the pull-down sections of these cells are OFF) immediately before the active-to-sleep transition occurs. However, this case barely happens in practice, because if there is at least one cell in $C_1$ with output value set to logic 0 (i.e., its pull-down section is ON) before the active-to-sleep transition and if the sleep period is sufficiently long, then the steady-state value for the virtual ground voltage after entering the sleep mode will be nearly $V_{DD}$. Clearly, considering that a sub-circuit will typically contain tens of logic cells, the probability of at least one of them having a logic 0 at its output (before entering the sleep mode) is nearly 1, i.e., indeed the virtual ground of sub-circuit $C_1$ will rise and reach near $V_{DD}$ after sufficient time is spent in the sleep mode. Similar discussion is valid for node P discharging during the sleep period.

When the sleep-to-active transition edge arrives at the gates of the sleep transistors to turn them on, Node G starts to fall toward zero, whereas Node P starts to rise toward $V_{DD}$. If the total capacitance in Node G is denoted $C_G$ and the total capacitance in the supply is denoted $C_P$, during the active-to-sleep transition, $C_G$ charges up from zero to $V_{DD}$, while $C_p$ discharges from $V_{DD}$ to 0. The situation is reversed for the sleep-to-active transition: in this case $C_G$ discharges from $V_{DD}$ to 0, while $C_p$ charges up to $V_{DD}$ from zero. These charge and discharge events on the virtual ground and $V_{DD}$ nodes represent wasteful dissipation of circuit energy.

Figure 2:
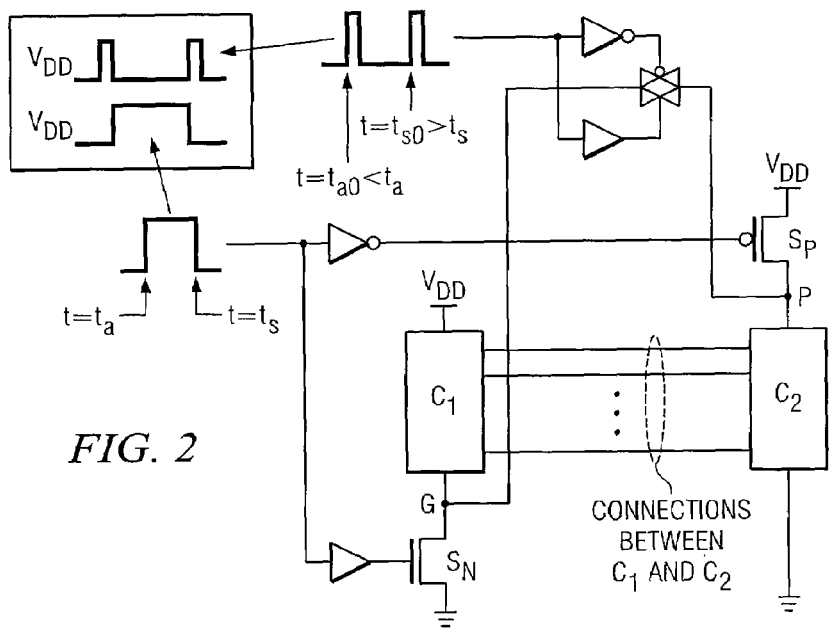
FIG. 2 illustrates an example power-gating structure including a transmission gate (TG) for charge recycling.

Particular embodiments reduce the energy consumed during switching between active and sleep modes of a circuit. Particular embodiments use a charge-recycling technique to reduce the switching power consumption during the active-to-sleep and sleep-to-active transitions by adding a TG between the virtual ground and supply nodes, as illustrated in FIG. 2. FIG. 2 illustrates an example power-gating structure including a TG for charge recycling;

Particular embodiments use the following charge-recycling strategy. The TG is turned on (i) immediately before turning on the sleep transistors while going from sleep to active mode, and (ii) just after turning off the sleep transistors while going from active to sleep mode. Turning on the TG at the end of the sleep mode as the circuit is about to go from sleep to active mode allows charge sharing between the completely charged up capacitance $C_G$ and the completely discharged capacitance $C_P$. After the charge recycling is completed, the common voltage of the virtual ground and virtual supply is $\alpha V_{DD}$, where $\alpha$ is a positive real number less than 1. The value of $\alpha$ depends on the relative sizes of $C_G$ and $C_P$. As a result, power consumption due to use of the sleep transistors is reduced. This is because, in this case, there is a transition from $\alpha V_{DD}$ to 0 at the virtual ground and from $\alpha V_{DD}$ to $V_{DD}$ at the virtual supply; whereas, in a conventional MTCMOS circuit without charge recycling, the transition is from $V_{DD}$ to 0 and from 0 to $V_{DD}$ at the virtual ground and supply nodes, respectively. This charge-recycling technique helps reduce power consumption in the transition from active to sleep mode as well.

The following describes the calculation of power savings and conditions for achieving the same, considering two different mode transitions: sleep-to-active and active-to-sleep.

Figure 3:
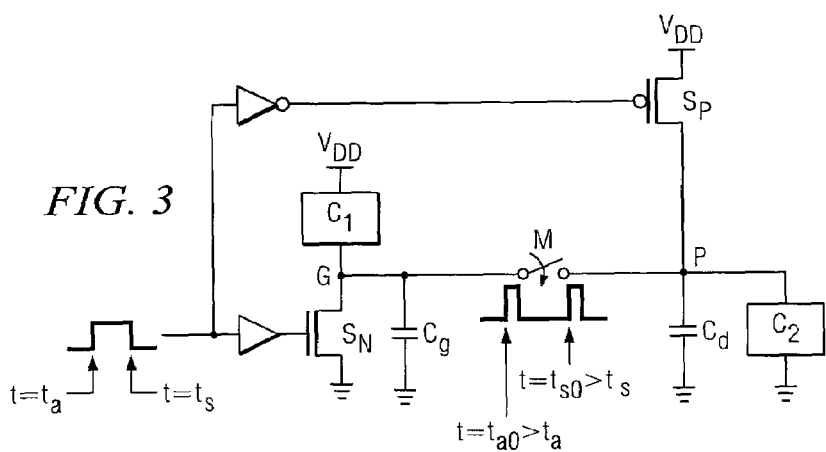
FIG. 3 illustrates an example power-gating structure including a switch for charge recycling.

For wake-up transition, consider FIG. 3. FIG. 3 illustrates an example power-gating structure including a switch for charge recycling. In FIG. 3 $C_G$ and $C_P$ represent the total capacitance in the virtual ground and supply nodes, respectively. Assume that the sleep period is long enough such that $C_G$ has had time to charge up to some value close to $V_{DD}$ while $C_P$ has had time to completely discharge to some small value close to 0. Otherwise, the voltage of $C_G$ and $C_P$ will be a function of the length of the sleep period.

To go from sleep mode to active mode, instead of simply turning on sleep transistors, particular embodiments first allow charge recycling between $C_G$ and $C_P$. To do that, particular embodiments close switch M at time $t=t_{a0}$. Assuming ideal charge sharing between $C_G$ and $C_P$, the common voltage value of nodes G and P after charge sharing may be calculated by equating the total charge in both capacitances before and right after charge recycling:

$$V_{f\_sa} = \alpha V_{DD} \quad (1)$$
$$\alpha = \frac{C_G}{C_G + C_P}$$

The common voltage value of the virtual ground and virtual supply at the end of the charge sharing is $\alpha V_{DD}$. After the charge sharing is complete, i.e., at time $t=t_{a1}$, particular embodiments open switch M and then turn on the SN and SP sleep transistors. As a result, there will be a path from the virtual ground to the (actual) ground going through SN which causes $C_G$ to discharge to 0. There will also be a path from the virtual supply to the (actual) supply going through $S_P$ which causes $C_P$ to charge up to $V_{DD}$. Neglecting the energy consumption in the switch itself for now, the total energy drawn from the power supply is due to the process of charging capacitance $C_P$ which may be obtained as follows:

$$E_{sleep\text{-}active} = C_P V_{DD} \times (\Delta V) \quad (2)$$
$$= C_P V_{DD} \times (V_{DD} - V_{f\_sa})$$

Substituting from Equation (1) for $V_{f\_sa}$, obtains the energy consumption from the power supply in sleep-active transition:

$$E_{sleep\text{-}active} = C_P V_{DD} \times (V_{DD} - \alpha V_{DD}) \quad (3)$$
$$= (1 - \alpha) C_P V_{DD}^2$$

For sleep transition, again consider FIG. 3. To go from active mode to sleep mode, instead of simply turning off the sleep transistors, particular embodiments effect charge recycling between $C_G$ and $C_P$ as soon as the circuit enters the sleep mode. Particular embodiments close switch M at $t=t_{s0}$ which is the time when the sleep transistors are turned off. The voltages of the virtual ground and virtual supply nodes at this time are 0 and $V_{DD}$, respectively. Assuming ideal charge sharing between $C_G$ and $C_P$, the common voltage of nodes G and P after charge sharing is calculated by equating the total charge in both capacitances right before and after the charge sharing:

$$V_{f\_as} = \beta V_{DD} \qquad (4)$$

$$\beta = \frac{C_P}{C_G + C_P}$$

Based on the above equation, the common voltage of the virtual ground and virtual supply at the end of the charge sharing is $\beta V_{DD}$. By the time the charge recycling is complete ($t=t_{s1}$) particular embodiments open the switch. After opening the switch, there is a leakage path from the power supply to the virtual ground going through logic block $C_1$ which eventually causes $C_G$ to charge up to $V_{DD}$. There is also a leakage path from the virtual supply to the ground going through logic block $C_2$ which eventually causes $C_P$ to discharge into the ground. Again, neglecting the power consumption in the switch, the total energy consumed from the power supply is in this case a result of charging up the capacitance $C_G$, and this energy consumption may be calculated in particular embodiments as follows:

$$E_{active\text{-}sleep} = C_G V_{DD} \times (\Delta V) \qquad (5)$$
$$= C_G V_{DD} \times (V_{DD} - V_{f\_as})$$

Substituting from Equation (4) for $V_{f\_as}$ obtains the following:

$$E_{active\text{-}sleep} = C_G V_{DD} \times (V_{DD} - \beta V_{DD}) \qquad (6)$$
$$= (1 - \beta) C_G V_{DD}^2$$

Since $\alpha + \beta = 1$, the total energy consumption may be calculated by adding $E_{active\text{-}sleep}$ and $E_{sleep\text{-}active}$, which results in the following:

$$E_{cr\_total} = E_{active\text{-}sleep} + E_{sleep\text{-}active} \qquad (7)$$
$$= \alpha C_G V_{DD}^2 + \beta C_P V_{DD}^2$$

where $E_{cr\text{-}total}$ is energy consumption with charge recycling.

The total energy consumption may be calculated when no charge recycling occurs between P and G, yielding the following:

$$E_{total} = C_G V_{DD}^2 + C_P V_{DD}^2 \qquad (8)$$

From Equations (7) and (8) and after substituting for $\alpha$ and $\beta$ from Equations (1) and (4), the energy saving ratio (ESR) may be calculated as follows:

$$ESR(X) = \frac{E_{total} - E_{cr\_total}}{E_{total}} = \frac{2X}{(1+X)^2} \qquad (9)$$

where X is defined as the ratio of the virtual ground capacitance to the virtual supply capacitance, or $X=C_G/C_P$. The optimum value for X which maximizes ESR(A) may be obtained by equating the derivative of this ratio to zero, which results in X=1, or $C_G=C_P$. In other words, in particular embodiments, equal capacitances in virtual ground and virtual supply provide the best energy savings. Then the maximum energy saving is the following:

$$ESR_{max} = ESR(X)|_{X=1} = 5 \qquad (10)$$

This means that particular embodiments may obtain a maximum energy savings of approximately 50% as a result of charge recycling. However, considering the power needed to turn the TG on or off, the total saving ratio may be less than 50%.

Figure 4:
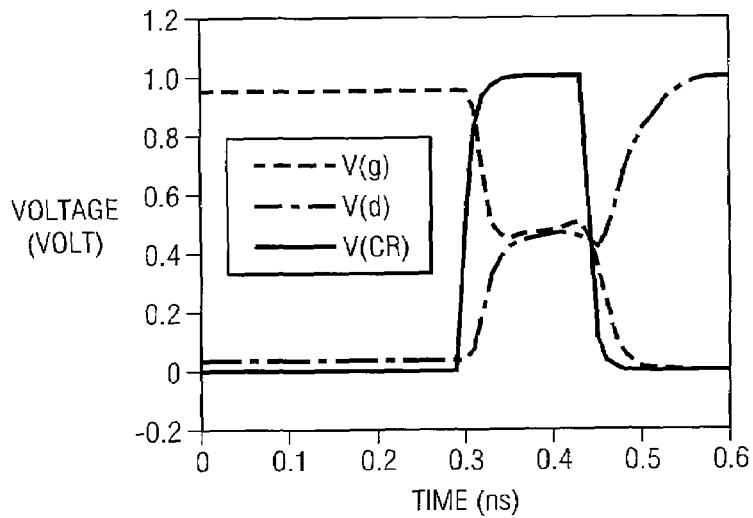
FIG. 4 illustrates example waveforms for an example charge-recycling operation when transitioning from sleep to active mode.

FIG. 4 illustrates example waveforms for an example charge-recycling operation when transitioning from sleep to active mode. In FIG. 4, $C_G$ equals $C_P$ and the transition is from sleep mode to active mode by an inverter chain using approximately 70 nm CMOS technology. FIG. 4 depicts the virtual ground voltage, $V_G$, the virtual supply voltage, $V_P$, and the charge-recycling signal, $V_{CR}$.

The above equations are based on the assumption of having an ideal charge-recycling process between $C_G$ and $C_P$. Under this scenario, it may be assumed that little or no energy is consumed to switch the TG on and off. It may also be assumed that the TG is "ON" while charge recycling is occurring. However, because of dynamic power consumption in the TG and the possibility of having incomplete charge sharing, this is not a perfect replacement in practice. The following description considers the effects of the TG threshold voltage and sizing on the ESR and the wake-up time of the charge-recycling configuration.

The following description considers a more realistic charge-recycling scenario where the ideal switch is replaced with a practical circuit model of a CMOS TG. The following description then considers the effect of transistor threshold voltages on power saving and delay of the circuit.

Figure 5:
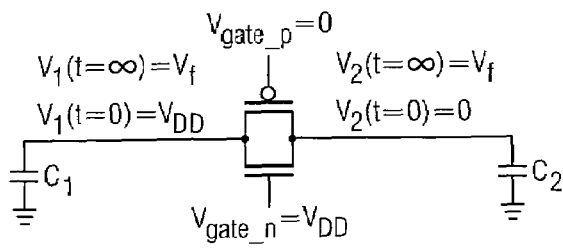
FIG. 5 illustrates an example circuit equivalent of an example charge-sharing configuration.

FIG. 5 illustrates an example circuit equivalent of an example charge-sharing configuration. To have a complete charge sharing, the TG should stay "ON" for the duration of the charge-sharing process. To have this property, the absolute values of the threshold voltages of the N and P transistors of the TG should be relatively small. To facilitate this, the common final voltage of virtual ground and virtual supply, i.e., $V_f$, should satisfy at least one of the following two inequalities:

$$\begin{cases} V_{t,n} \leq V_{DD} - V_f \\ \text{or} \\ |V_{t,p}| \leq V_f \end{cases} \qquad (11)$$

where $V_{t,n}$ and $V_{t,p}$ denote threshold voltages of the NMOS and PMOS transistors in the TG accounting for the body effect. $V_f$ may be obtained from Equation (1) for the active-to-sleep case and from Equation (4) for the sleep-to-active case. The inequalities substantially guarantee that at least one of the transistors in the TG remains "ON" for the duration of the charge-sharing process.

In the case of equal capacitive loads in virtual ground and virtual supply ($C_G=C_P$) complete charge sharing in both active-to-sleep and sleep-to-active cases results in a common final voltage value of $V_f=V_{DD}/2$, and Equation (11) translates into $\text{Min}\{V_{t,n}, |V_{t,p}|\} \leq V_{DD}/2$. $V_{DD}/2$. If this condition is not satisfied, the charge recycling is not complete and the ESR will be less than predicted. In this case, if $V_{tn}=|V_{tp}|$, particularly embodiments simply use a pass transistor instead of a TG.

Sizing of the TG is another factor that may affect the ESR as well as the wake-up time of the circuit. In particular embodiments, in case of the original configuration (when there is not any charge recycling) the wake-up time may be defined as the time between the sleep transistors being turned on and the voltage of the virtual ground reaching approximately 10% of its final value. However, in a circuit that uses charge recycling, the wake-up time may be defined as the time between the TG being turned on and the virtual ground voltage dropping below approximately 10% of its final value. The following description considers the effect of the dynamic power consumption of the TG on the ESR calculated above.

Figure 6:
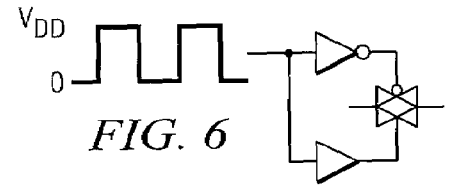
FIG. 6 illustrates an example TG.

FIG. 6 illustrates an example TG. Assume an input capacitance of $C_{tg}$ for the NMOS transistor of the TG and the same input capacitance for the PMOS transistor of the TG. In each active-sleep-active cycle, particular embodiments should switch the TG on twice: once before turning the sleep transistors on and once after turning them off. Every time TG is turned on, both NMOS and PMOS transistors in the TG are actually being turned on, i.e., the switched capacitance is $2C_{tg}$. The TG is turned off after the charge sharing is complete. Therefore, in particular embodiments, the dynamic energy consumption of the TG for one complete active-sleep cycle may be calculated as follows:

$$E_{tg-total} = 4 \times \frac{1}{2} \times (2C_{tg})V_{DD}^2 = 4C_{tg}V_{DD}^2 \qquad (12)$$

Therefore, to calculate the actual ESR, particular embodiments should subtract the correction ratio $E_{tg-total}/E_{total}$ from the ideal ESR in Equation (9). The correction ratio may be calculated as follows:

$$\frac{E_{tg-total}}{E_{total}} = \frac{4C_{tg}V_{DD}^2}{(C_G + C_P)V_{DD}^2} = \frac{4C_{tg}}{C_G + C_P} \qquad (13)$$

This correction ratio is proportional to the size of the TG, since $C_{tg}$ itself is MTCMOS configuration. FIG. 7B illustrates a resistive network for a CR MTCMOS configuration. In FIG. 7B, there is a new path from $V_{DD}$ to ground going through $r_1$, RTG, and $r_2$. Since C1 and C2 consist of LVT transistors, $r_1$ and $r_2$ are relatively small resistances. To avoid having a high leakage path from supply to ground, particular embodiments make RTG as large as possible; this is possible by using HVT transistors in the TG. Assume that $R_{TG}=nR$ for some n. Knowing that $R \gg r_1, r_2$ and doing Δ-Y transformation for r1, RTG, and RP arrives at the resistive network illustrated in FIG. 7C, where $r_1^*$, $r_2^*$, and $r_3^*$ may be calculated as follows:

$$r_1^* = \frac{r_1 R_P}{r_1 + R_{TG} + R_P} = \frac{1}{n+1} r_1 \qquad (15)$$

$$r_2^* = \frac{r_1 R_{TG}}{r_1 + R_{TG} + R_P} = \frac{n}{n+1} r_1$$

$$r_3^* = \frac{R_P R_{TG}}{r_1 + R_{TG} + R_P} = \frac{n}{n+1} R$$

Total resistance from supply to ground may be calculated as follows:

$$R_{total-CR} = \frac{n}{2n+1} R \qquad (16)$$

The leakage power in this case may be written as follows:

$$P_{leakage-CR} = \left(2 + \frac{1}{n}\right) \frac{V_{DD}^2}{R} \qquad (17)$$

As seen in Equation (17), the leakage power consumption increases by a factor of (1+1/2n) compared with the conventional power-gating method. If $R_{TG}=2R$, n is equal to 2 and there is a 25% increase in the leakage power. If the sleep period of the circuit is small, then this 25% increase in leakage energy consumption is negligible compared with the 50% switching energy savings achieved by using the charge-recycling MTCMOS structure. On the other hand, if the sleep period is very long, the resistance of the TG should be increased to use a larger n. This is possible by choosing transistors with smaller W/L ratios in the TG, which is also beneficial from the point of view of layout area. In particular embodiments, a potential disadvantage is that charge recycling will take longer to complete since the TG will have a larger ON resistance. proportional to the size of the TG. However, in particular embodiments, because there are usually too many gates connected to the virtual ground and virtual supply, $C_G+C_P$ is usually much larger than $C_{tg}$, i.e., the correction ratio is usually in the order of few percents, which makes the actual ESR less than the ideal ESR, 50%, by only a few percentage points.

By increasing the size of the TG, particular embodiments may speed up the charge-sharing process, and as a result reduce the wake-up time. However, this may also increase the correction ratio given in Equation (13), hence decreasing the ESR of the circuit. Therefore, in particular embodiments, there is a trade-off between the wake-up time and the ESR.

In particular embodiments, in charge-recycling MTCMOS, the larger the TG size, the smaller the wake-up time of the circuit. The increased size, however, may increase the dynamic power consumption of the TG. Using a large enough TG may make the charge-sharing time small enough to obtain a wake-up time which is as small as, or sometimes even less than, the wake-up time of the original circuit without charge recycling. However, as seen from Equation (12), increasing the size of the TG also increases its energy consumption. In particular embodiments, the size needed for the TG to maintain, or sometimes improve, the original wake-up time causes only a small percentage loss of the ideal ESR.

Figure 7A:
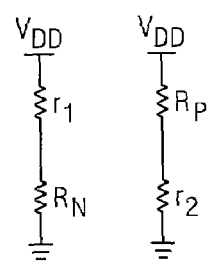
FIGS. 7A-7C illustrate example resistive networks for example MTCMOS configurations.
Figure 7B:
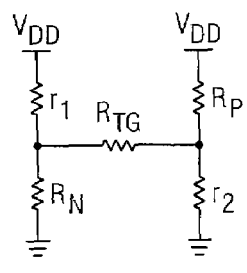
Figure 7C:
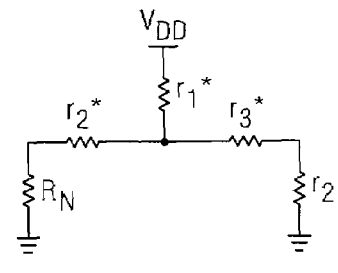

FIGS. 7A-7C illustrate example resistive networks for example MTCMOS configurations. In FIG. 7A-7C, $r_1$ and $r_2$ represent the resistances of logic blocks $C_1$ and $C_2$, respectively, and $R_N$ and $R_p$ represent the resistances of NMOS and PMOS sleep transistors, respectively. In FIG. 7A, which illustrates a resistive network for a conventional MTCMOS configuration, during the sleep period, two different paths from $V_{DD}$ to ground exist. Since $C_1$ and $C_2$ consist of LVT transistors and sleep transistors are HVT transistors, it may be assumed in particular embodiments that $R_N, R_P \gg r_1, r_2$. For purposes of simplification, it may be assumed that $R_N=R_P=R$. The total resistance from the power supply to the ground is thus $R_{total-conv.}=R/2$ and the leakage power consumption may be calculated as follows:

$$P_{leakage-conv.} = \frac{2V_{DD}^2}{R} \qquad (14)$$

Next, consider the leakage power consumption of the charge-recycling (CR)

Figure 8:
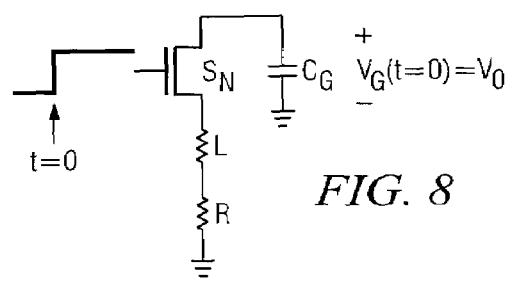
FIG. 8 illustrates an example resistor-inductor (RL) equivalent model of ground.

Ground and power line bounces are important design concerns with regard to power-gating structures. GB typically occurs in power-gating structures at the sleep to active transition edge. FIG. 8 illustrates an example RL equivalent model of ground. After the sleep transistor is turned on at the end of the sleep period, a large amount of current flows to ground. A simple RL model may be adopted for purposes of GB analysis. Because of the large di/dt at turn-on time, there is a large voltage, Ldi/dt, appearing across the inductance. The following describes the effects of charge recycling on the GB of the circuit in particular embodiments.

Figure 9:
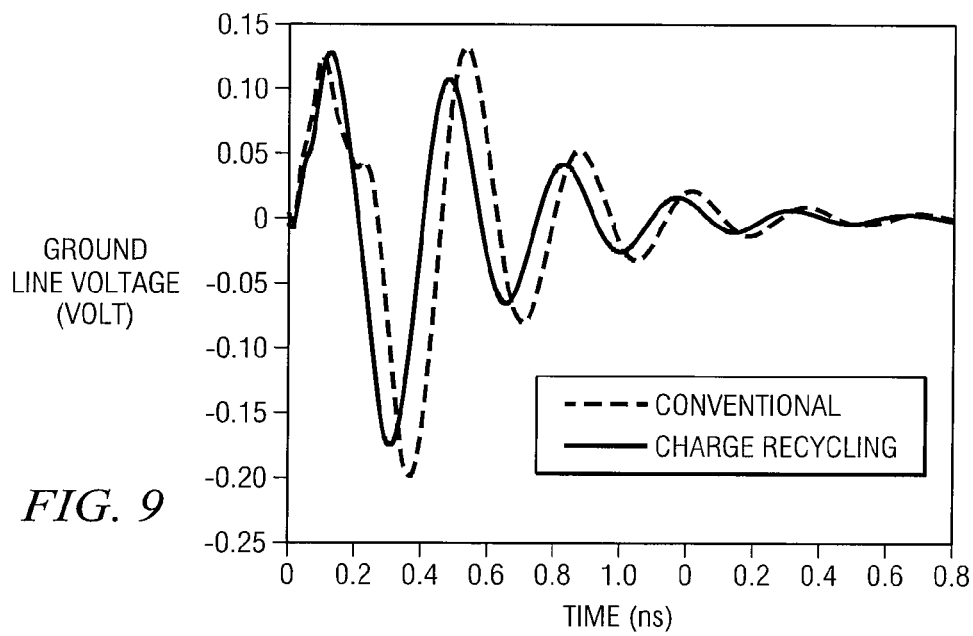
FIG. 9 illustrates an example comparison between example ground bounce (GB) waveforms.

In FIG. 8, the virtual ground capacitance, $C_G$, is connected to the RL circuit (modeling the pin-package parasitics of the IC) via the sleep transistor, $S_N$. At t=0, the sleep transistor is turned on and it may be assumed that the initial voltage of $C_G$ at this time is $V_0$, i.e., $V_G(t=0)=V_0$. In particular embodiments, the positive peak value of the GB occurs during the time when $S_N$ operates in the saturation region. Although the peak value does not depend on voltage $V_0$, the peak value depends on the values of R, L, $C_G$, $V_{Tn}$, and $V_{DD}$. Therefore, in particular embodiments, charge recycling (which may change $V_0$ from $V_{DD}$ to $V_{DD}/2$) does not significantly change the positive peak value of the GB. However, the negative peak value of the GB and the GB settling time both depend on $V_0$. Furthermore, both of these quantities decrease as $V_0$ is reduced. Therefore, both the negative peak value and the settling time of the GB voltage are expected to decrease for the charge recycling MTCMOS. Degrees of improvement in the negative peak and settling time depend on the relative values of L, $C_G$, R, $V_{DD}$, and the sleep transistor parameters. FIG. 9 illustrates a comparison between example GB waveforms resulting from conventional and charge-recycling power-gating structures for an inverter chain in approximately 70 nm CMOS technology. The positive peak value is substantially the same for both cases, but the negative peak value and the settling time are smaller for the charge-recycling MTCMOS structure.

Particular embodiments use charge recycling in MTCMOS circuits. In particular embodiments, applying a charge-recycling technique to an MTCMOS circuit saves up to approximately 50% of the mode-transition energy while maintaining the wake-up time of the original circuit. In particular embodiments, applying a charge-recycling technique reduces the negative peak voltage value and the settling time of the GB. Although leakage in the sleep mode of the circuit may go up as a result of the charge-recycling structure, the effect may be well controlled by sizing down the TG, by judiciously selecting the HVT level to be used for both sleep transistors and charge recycling TG transistors in the first place, or by using higher $V_t$ values for the transistors in the TG compared with those for the sleep transistors. Since the subthreshold leakage current of a MOS transistor exponentially depends on the threshold voltage of the transistor, a slight increase in the threshold voltage value of the TG will result in a large difference in the resistance value of the gate or in a large n value in Equation (17), which makes the increase in the leakage power consumption substantially negligible in particular embodiments.

Particular embodiments use charge recycling in standard cell designs. Consider a standard cell-based design having a generated detailed placement. Applying a power-gating method, e.g., MTCMOS, may reduce leakage-power consumption of such a design. In addition, applying a charge-recycling technique to the resulting power-gating configuration may reduce switching-power consumption during mode transition. Particular embodiments have three different cells in a cell library: an NMOS sleep transistor cell, a PMOS sleep transistor, and a charge-recycling TG cell (alternatively, a single pass transistor may be used instead of the TG cell). Every other cell in the design should connect to either an NMOS or a PMOS sleep transistor cell to enable circuit-wide power gating. In other words, each logic cell, e.g., NAND cell, AND-OR invert (AOI) cell, multiplexer (MUX) cell, etc., in the design should have connections either to actual $V_{dd}$ and virtual ground or to virtual $V_{dd}$ and actual ground. This means that each library cell is still designed as in conventional (non MTCMOS-based) designs. The difference is how to connect the cell $V_{dd}$ and ground terminals to the chip $V_{dd}$ and ground terminals. If the connection is made via a metal line, the cell supply will be the same as the chip supply line. Otherwise, the cell supply would be connected to the virtual supply and, subsequently, the virtual supply would be connected to the chip supply through appropriate N- or P- type sleep transistors.

Consider a standard cell row in the design, which has some of its cells connected to an NMOS sleep transistor, while the remaining cells are connected to a PMOS sleep transistor. Since this row uses both NMOS and PMOS sleep transistor cells from the library, virtual ground and power lines are needed, as well as actual ground and power lines for this single row, which is clearly inefficient in terms of cell area or routing area needed to accommodate all this. Therefore, particular embodiments force the restriction that the same kind of sleep transistor be used for all the cells lying in the same standard cell row. In other words, all cells in a single row of the design are connected to NMOS or PMOS sleep transistor, but not both. Furthermore, to facilitate the placement and routing of the charge recycling cells, particular embodiments effect charge recycling between consecutive rows, i.e., particular embodiments force the additional constraint that, for example, even-numbered rows be connected to the NMOS sleep transistor, whereas odd-numbered rows be connected to the PMOS sleep transistor. Particular embodiments use one or multiple TGs to connect the virtual ground line of row 2k to the virtual power line of row 2k+1, etc.

Figure 10:
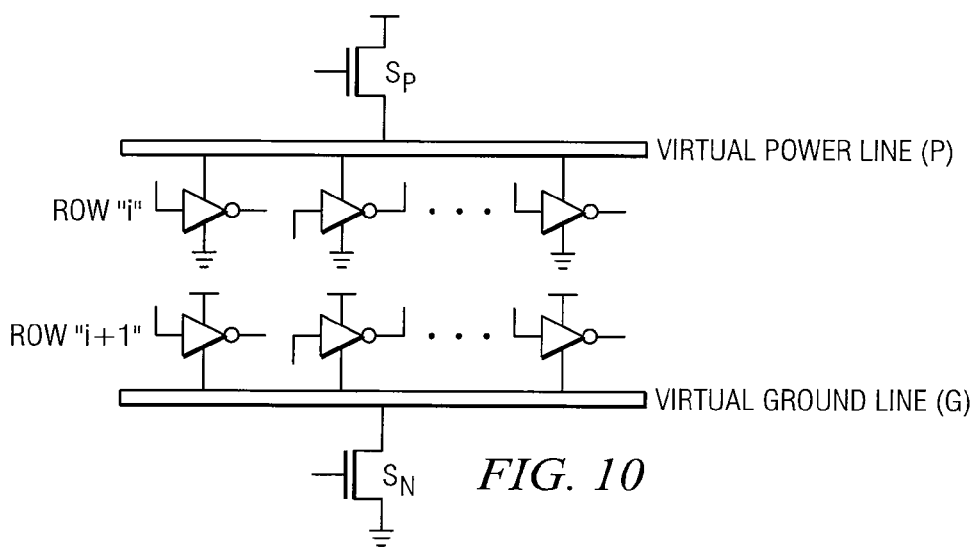
FIG. 10 illustrates two example rows in an example cell design.

FIG. 10 illustrates two example consecutive rows in an example cell design. All the gates in the upper row are connected to the virtual power line, and all the gates in the lower row are connected to the virtual ground line. A PMOS sleep transistor connects virtual power line to the actual power; an NMOS sleep transistor connects the virtual ground line to the actual ground. The sleep transistors are themselves placed on the cell rows.

Figure 11:
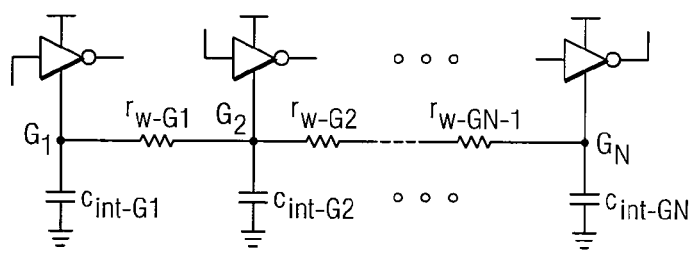
FIG. 11 illustrates an example circuit model of a row illustrated in FIG. 10.

Assume that the virtual ground and power lines are modeled by distributed RC networks. FIG. 11 illustrates an example circuit model of a row illustrated in FIG. 10. The row is connected to the virtual ground line, in the presence of virtual ground RC parasitics. Here, $r_{w\text{-}Gi}$ ($r_{w\text{-}Pi}$) denotes the wiring resistance between nodes $G_i$ ($P_i$) and $G_{i+1}$ ($P_{i+1}$) and $c_{int\text{-}Gi}$ ($c_{int\text{-}Pi}$) represents the interconnect capacitance at node $G_i$ ($P_i$). The expressions inside the parentheses give similar notation for different parameters of the virtual supply line. $G_i$ is the connection node of the $i^{th}$ cell in the lower row to the virtual ground line, and $P_i$ is the connection node of the $i^{th}$ cell in the upper row to the virtual power line.

If the resistance and capacitance of the power and the ground networks are ignored, the active performance of the circuit does not depend on the location of the sleep transistor. Otherwise, e.g., when the resistance and the capacitance of the networks are not ignored, different placement choices for the sleep transistor cell may cause the circuit to perform differently. Particular embodiments look for the sleep transistor cell placement that gives the best active performance for the circuit. Hence, in particular embodiments, placement (along with sizing) of sleep transistors is an important issue.

Charge recycling may reduce the wake-up time of the circuit if size of the charge-recycling TG is chosen appropriately. If the resistance and capacitance of the power and the ground networks are ignored, the charge-recycling time (which is defined as the time needed for the charge-recycling TG cell to remain ON to have at least (1-δ) percentage of the full charge recycling completed) may be determined by the total capacitance of the virtual ground and virtual supply and the size of the TG. When the resistance and the capacitance of the networks are not ignored, charge-recycling time depends not only on the total capacitance of the virtual ground and virtual supply and the size of the TG, but also on the placement of the TG. From the perspective of charge recycling, the placement and the sizing of the TG are important considerations.

In particular embodiments, more than one TG cell may be used to connect different nodes of the virtual ground line of a row to different nodes of the virtual power line of the row next to it to reduce the charge-recycling time that is required. Therefore, the number of TG cells used is an important consideration too.

Particular embodiments address and substantially solve the following problem: sizing and placement of sleep transistor cells for each cell row for a given standard cell design. Particular embodiments solve this problem by minimizing an active-mode delay penalty.

For each row of the standard cell based circuit, particular embodiments specify one sleep transistor cell. Particular embodiments perform placement and sizing of the sleep transistor cell in the presence of the RC virtual power and virtual ground networks. For simplicity, consider the case of an NMOS sleep transistor that connects the virtual ground line to the actual ground. Placement and sizing methods for the PMOS sleep transistor may be performed similarly.

Figure 12:
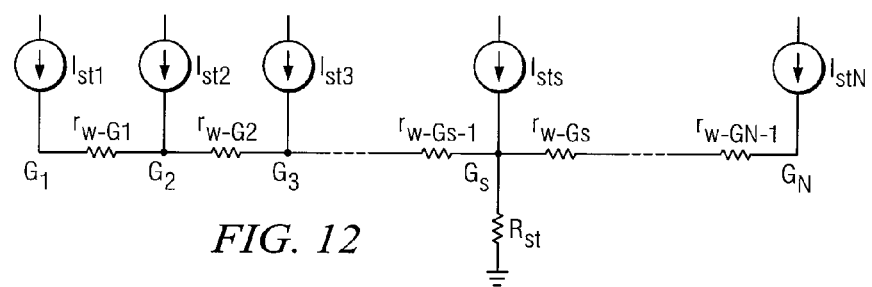
FIG. 12 illustrates another example circuit model of a row illustrated in FIG. 10.

Consider the example cell row represented in FIG. 11, where an NMOS sleep transistor drives all the cells in the row. During the active mode of the circuit and in the presence of the RC ground network, FIG. 12 may replace FIG. 11. In FIG. 12 (which illustrates another example circuit model of a row illustrated in FIG. 10) a current source, $I_{sti}$, which represents the switching current of that gate during the active mode, replaces each gate $G_i$. For simplicity, particular embodiments do not consider the effect of interconnect capacitances at different nodes in virtual ground line in the analysis for sleep transistor sizing. Such capacitances may be needed only for purposes of dynamic noise analysis, whereas in most cases a DC analysis is adequate for power network analysis and optimization.

In the absence of sleep transistor and virtual ground RC network, propagation delay of gate i may be approximated as follows:

$$T_{pd_i} \propto \frac{C_{L_i} V_{DD}}{(V_{DD} - V_{tL})^\alpha} \tag{18}$$

where $C_{Li}$ is the load capacitance of the gate i, $V_{tL}$ is the threshold voltage of the low-$V_t$ logic cell, and α is the velocity saturation index in modeling the short channel effect. In the presence of the sleep transistor and resistive network in the virtual ground, propagation delay of the logic cell i increases as follows:

$$T_{pd-MT_i} \propto \frac{C_{L_i} V_{DD}}{(V_{DD} - V_{G_i} - V_{tL})^\alpha} \tag{19}$$

where $V_{Gi}$ is the voltage drop on node $G_i$, which may be calculated by writing the KCL equations at different nodes of FIG. 12. Assuming that the sleep transistor is placed at node $G_s$:

$$V_{G_s} = R_{st} \sum_{i=1}^{N} I_{st_i} \tag{20}$$

where $R_{st}$ is the sleep transistor resistance in its linear mode and N is the total number of cells in the row. A recursive relationship may be written for the voltage of an arbitrary node $G_n$, n≠s, as follows:

$$V_{G_n} = \begin{cases} r_{w-G_n} \sum_{i=1}^{n} I_{st_i} + V_{G_{n+1}} & n < s \\ r_{w-G_{n-1}} \sum_{i=n}^{N} I_{st_i} + V_{G_{n-1}} & n > s \end{cases} \tag{21}$$

Particular embodiments now want to find the best discrete location (node) for placing the sleep transistor that minimizes the worst-case active delay of the circuit. To do that, particular embodiments need to know which logic cells on the row lie on the critical path of the circuit. Consider a circuit the detailed placement of which has been done and therefore, by running a static timing analysis tool, particular embodiments may easily determine those cells on each standard cell row that belong to the set of most critical paths of the circuit. On each cell row, a subset of logic cells may thus be identified as belonging to a most critical path of the circuit. For the $i^{th}$ cell row, this subset may be called $S_{CPi}$, which includes the indices of the cells of this row that are on a critical path of the circuit. In the remainder of this analysis, consider a single critical path in the circuit. However, the present invention contemplates extension to more than one critical path.

Since the worst-case delay of the circuit, $T_C$, is equal to the summation of propagation delays of different logic cells on the circuit critical path:

$$T_C = \sum_{i=1}^{L} \sum_{j \in S_{CP_i}} T_{pd-MT_j}^{(i)} \tag{22}$$

where L is the total number of rows in the circuit and $T^{(i)}_{pd-MT_j}$ is the propagation delay of the $j^{th}$ timing-critical logic cell in the $i^{th}$ row. The propagation delay for a cell connected to an NMOS sleep transistor may be calculated from Equation (19). The inner summation term in Equation (22) calculates the propagation delay through critical cells in the $j^{th}$ row.

Since the contribution of each row to the critical-path delay is independent of the contributions of the others, the propagation delay may be minimized for different rows separately. In other words, for each typical row i, particular embodiments solve the following problem:

$$\hat{s}_i = \arg\min_{1 \le s \le N} \left( \sum_{j \in S_{CP_i}} T^{(i)}_{pd-MT_j} \right) \quad (23)$$

where $\hat{s}_i$ is the optimum location of the sleep transistor in this row, and N is the total number of gates in this row. The minimization may be performed in linear time by a simple search on different values for s. For any fixed value of $R_{st}$, a single optimum solution for the problem will result.

In particular embodiments, sleep-transistor sizing is performed by an algorithm that chooses a large enough sleep transistor to make the increase in the active-mode delay of the circuit at most equal to δ% of the circuit delay in the absence of the sleep transistor. Particular embodiments use a range of between approximately 5% and approximately 10% for δ'.

To find the size of the sleep transistor that satisfies this delay condition, for any fixed position for the sleep transistor in cell row i, particular embodiments solve the following equation:

$$\sum_{j \in S_{CP_i}} T^{(i)}_{pd-MT_j} = (1+\delta) \sum_{j \in S_{CP_i}} T^{(i)}_{pd_j} \quad (24)$$

where the right-hand side uses Equation 18, corresponding to when there is no sleep transistor. Then a recursive algorithm (which uses placement and sizing algorithms together) may be used to perform simultaneous placement and sizing of sleep transistor in a row.

Figure 13:
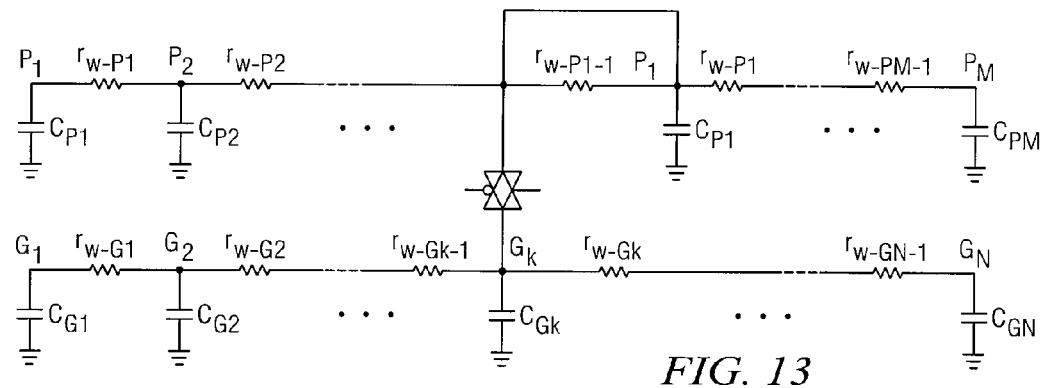
FIG. 13 illustrates an example charge-recycling cell connecting two different rows.

After placing and sizing sleep transistors for each row, particular embodiments add charge-recycling cells and connect them to two adjacent rows to reduce the energy consumption that occurs during mode transition. FIG. 13 illustrates an example charge-recycling cell connecting two different rows. FIG. 13 is valid for sleep mode and sleep-to-active transition.

As shown in FIG. 13, an RC ladder network may replace each row, as described above with respect to FIG. 11. In contrast to the circuit model in FIG. 11, the charge-recycling cell in FIG. 13 does not have a current source, since the row is in sleep mode and current sources are used for active-mode modeling. Instead, $C_{Gi}$ and $C_{Pi}$ in FIG. 13 have replaced capacitances $c_{int-Gi}$ and $c_{int-Pi}$ in FIG. 11, respectively. $C_{Gi}$ and $C_{Pi}$ may be defined as follows:

$$C_{G_i} = c_{int-G_i} + C_{d-G_i}$$

$$C_{P_i} = c_{int-P_i} + C_{d-P_i} \quad (25)$$

where $C_{d-Gi}$ and $C_{d-Pi}$ are the total diffusion capacitances of nodes $G_i$ and $P_i$, respectively. For nodes connected to the sleep transistors, the diffusion capacitance of the sleep transistor may be added to the values above. As described above, during sleep mode, all the $C_{Gi}$ capacitances charge up to $V_{DD}$ and all the $C_{Pi}$ capacitances fully discharge. During active mode, all the $C_{Pi}$ capacitances will charge up to a high voltage, possibly close to $V_{DD}$, and all the $C_{Gi}$ capacitances will discharge to a low voltage, possibly close to GND. Before going from sleep mode to active mode, a portion of the charge of the virtual ground capacitances may be allowed to migrate toward the virtual power capacitances to reduce the overall energy consumption during mode transition.

Particular embodiments apply a charge-recycling technique to minimize power consumption during mode transition in a power-gated structure in the presence of virtual ground and virtual power RC networks for standard cell-design circuits.

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend.

What is claimed is:

1. A circuit comprising:
   a first circuit block connected to ground via a first sleep transistor;
   a virtual ground node between the first circuit block and the first sleep transistor;
   a second circuit block connected to a supply via a second sleep transistor;
   a virtual supply node between the second circuit block and the second sleep transistor; and
   a transmission gate (TG) or a pass transistor connecting the virtual ground node to the virtual supply node to enable charge recycling between the first circuit block and the second circuit block during transitions by the circuit from active mode to sleep mode and from sleep mode to active mode.

2. The circuit of claim 1, wherein the first sleep transistor is an n-channel metal-oxide-semiconductor (NMOS) sleep transistor and the second sleep transistor is a p-channel metal-oxide-semiconductor (PMOS) sleep transistor.

3. The circuit of claim 1, wherein the TG comprises an n-channel metal-oxide-semiconductor (NMOS) transistor and a p-channel metal-oxide-semiconductor (PMOS) transistor, a source of the NMOS transistor being connected to a drain of the PMOS transistor, a drain of the NMOS transistor being connected to a source of the PMOS transistor.

4. The circuit of claim 1, wherein a size of the TG or the pass transistor maintains or reduces a wake-up time of the circuit.

5. The circuit of claim 1, wherein placement and sizing of the TG or pass transistor takes into account a wake-up delay, energy consumption due to mode transition, or both.

6. The circuit of claim 1, comprising a plurality of TGs or pass transistors.

7. A method comprising:
   switching a circuit from sleep mode to active mode, the circuit comprising a first circuit block connected to ground via a first sleep transistor, a virtual ground node between the first circuit block and the first sleep transistor, a second circuit block connected to a supply via a second sleep transistor, a virtual supply node between the second circuit block and the second sleep transistor, and a transmission gate (TG) or a pass transistor connecting the virtual ground node to the virtual supply node to enable charge recycling between the first circuit block and the second circuit block during transitions by the circuit from active mode to sleep mode and vice versa, the switch from sleep mode to active mode comprising:
   turning on the TG or the pass transistor; and
   turning off the TG or the pass transistor after a predetermined period of time has lapsed;

turning on the first and second sleep transistors after turning off the TG or the pass transistor; and switching the circuit from active mode to sleep mode, the switch from active mode to sleep mode comprising:
  turning off the first and second sleep transistors; and
  turning on the TG or the pass transistor after turning off the transistors; and
  turning off the TG or the pass transistor after a predetermined period of time has lapsed.

8. The method of claim 7, wherein the first sleep transistor is an n-channel metal-oxide-semiconductor (NMOS) sleep transistor and the second sleep transistor is a p-channel metal-oxide-semiconductor (PMOS) sleep transistor.

9. The method of claim 7, wherein the TG comprises an n-channel metal-oxide-semiconductor (NMOS) transistor and a p-channel metal-oxide-semiconductor (PMOS) transistor, a source of the NMOS transistor being connected to a drain of the PMOS transistor, a drain of the NMOS transistor being connected to a source of the PMOS transistor.

10. The method of claim 7, wherein a size of the TG or a size of the pass transistor maintains or reduces a wake-up time of the circuit.

11. A circuit comprising:
  at least one virtual ground line connected to ground via a first sleep transistor;
  at least one virtual supply line connected to a supply via a second sleep transistor;
  at least one first row of circuit blocks or group of circuit blocks that are each connected to the supply and to one of the virtual ground lines;
  at least one second row of circuit blocks or group of circuit blocks that are each connected to one of the virtual supply lines and to the ground;
  at least one TG or one pass transistor connecting the first row of circuit blocks or group of circuit blocks to an adjacent second row of circuit blocks or group of circuit blocks to enable charge recycling between circuit blocks in the first row or group of circuit blocks and circuit blocks in the second row or group of circuit blocks during transitions by the circuit from active mode to sleep mode, from sleep mode to active mode, or both.

12. The circuit of claim 11, wherein the first sleep transistor is an n-channel metal-oxide-semiconductor (NMOS) sleep transistor and the second sleep transistor is a p-channel metal-oxide-semiconductor (PMOS) sleep transistor.

13. The circuit of claim 11, wherein sizing and placement of the first sleep transistor with respect to the first row or group takes into account one or more of an active-mode delay penalty, area overhead, parasitics of virtual supply and group lines, energy consumption due to mode transition, or a wake-up delay target.

14. The circuit of claim 13, wherein the placement of the first sleep transistor with respect to the first row or group takes into account one or more of a delay of a critical timing path in the first row or group, the critical timing path in the first row or group comprising a subset of all the circuit blocks in the first row or group.

15. The circuit of claim 11, wherein sizing and placement of the second sleep transistor with respect to the second row or group takes into account one or more of an active-mode delay penalty, area overhead, parasitics of virtual supply and group lines, energy consumption due to mode transition, or a wake-up delay target.

16. The circuit of claim 15, wherein the placement of the second sleep transistor with respect to the second row or group takes into account a delay of a critical timing path in the second row or group, the critical timing path in the second row or group comprising a subset of all the circuit blocks in the second row or group.

17. The circuit of claim 11, wherein placement and sizing of the TG or pass transistor takes into account a wake-up delay, energy consumption due to mode transition, or both.

18. The circuit of claim 11, comprising a plurality of TGs or pass transistors.

* * * * *

UNITED STATES PATENT AND TRADEMARK OFFICE
CERTIFICATE OF CORRECTION

PATENT NO. : 7,400,175 B2
APPLICATION NO. : 11/755354
DATED : July 15, 2008
INVENTOR(S) : Farzan Fallah et al.

It is certified that error appears in the above-identified patent and that said Letters Patent is hereby corrected as shown below:

Col. 5, L. 65: After "ESR" delete "(A)" and insert --(X)--;

Col. 6, L. 4: After "$ESR_{max} = ESR(X) \mid_{x=1} =$" delete "5" and insert --0.5--;

Col. 6, L. 61: After "$\{V_{t,n}, |V_{t,p}|\}$" delete "$\leqq$" and insert --$\leq$--;

Col. 7, L. 43 after "itself is" insert --proportional to the size of the TG. However, in particular embodiments, because there are usually too many gates connected to the virtual ground and virtual supply, $C_G+C_P$ is usually much larger than $C_{tg}$, i.e., the correction ratio is usually in the order of few percents, which makes the actual ESR less than the ideal ESR, 50%, by only a few percentage points.

By increasing the size of the TG, particular embodiments may speed up the charge-sharing process, and as a result reduce the wake-up time. However, this may also increase the correction ratio given in Equation (13), hence decreasing the ESR of the circuit. Therefore, in particular embodiments, there is a trade-off between the wake-up time and the ESR.

In particular embodiments, in charge-recycling MTCMOS, the larger the TG size, the smaller the wake-up time of the circuit. The increased size, however, may increase the dynamic power consumption of the TG. Using a large enough TG may make the charge-sharing time small enough to obtain a wake-up time which is as small as, or sometimes even less than, the wake-up time of the original circuit without charge recycling. However, as seen from Equation (12), increasing the size of the TG also increases its energy consumption. In particular embodiments, the size needed for the TG to maintain, or sometimes improve, the original wake-up time causes only a small percentage loss of the ideal ESR.

FIGURES 7A-7C illustrate example resistive networks for example MTCMOS configurations. In FIGURE 7A-7C, $r_1$ and $r_2$ represent the resistances of logic blocks $C_1$ and $C_2$, respectively, and $R_N$ and $R_P$ represent the resistances of NMOS and PMOS sleep transistors, respectively. In FIGURE 7A, which illustrates a resistive network for a conventional MTCMOS configuration, during the sleep period, two different paths from $V_{DD}$ to ground exist. Since $C_1$ and $C_2$ consist of LVT transistors and sleep transistors are HVT transistors, it may be assumed in particular embodiments that $R_N, R_P \gg r_1, r_2$. For purposes of simplification, it may be assumed that $R_N=R_P=R$. The total resistance from the power supply to the ground is thus $R_{total\text{-}conv.}=R/2$ and the leakage power consumption may be calculated as follows:

UNITED STATES PATENT AND TRADEMARK OFFICE
CERTIFICATE OF CORRECTION

PATENT NO. : 7,400,175 B2
APPLICATION NO. : 11/755354
DATED : July 15, 2008
INVENTOR(S) : Farzan Fallah et al.

It is certified that error appears in the above-identified patent and that said Letters Patent is hereby corrected as shown below:

$$P_{leakage-conv.} = \frac{2V_{DD}^2}{R} \quad (14)$$

Next, consider the leakage power consumption of the charge-recycling (CR)--;

Col. 8, L. 28: After "ON resistance" delete "proportional to the size of the TG. However, in particular embodiments, because there are usually too many gates connected to the virtual ground and virtual supply, $C_G+C_P$ is usually much larger than $C_{tg}$, i.e., the correction ratio is usually in the order of few percents, which makes the actual ESR less than the ideal ESR, 50%, by only a few percentage points.
By increasing the size of the TG, particular embodiments may speed up the charge-sharing process, and as a result reduce the wake-up time. However, this may also increase the correction ratio given in Equation (13), hence decreasing the ESR of the circuit. Therefore, in particular embodiments, there is a trade-off between the wake-up time and the ESR.
In particular embodiments, in charge-recycling MTCMOS, the larger the TG size, the smaller the wake-up time of the circuit. The increased size, however, may increase the dynamic power consumption of the TG. Using a large enough TG may make the charge-sharing time small enough to obtain a wake-up time which is as small as, or sometimes even less than, the wake-up time of the original circuit without charge recycling. However, as seen from Equation (12), increasing the size of the TG also increases its energy consumption. In particular embodiments, the size needed for the TG to maintain, or sometimes improve, the original wake-up time causes only a small percentage loss of the ideal ESR.

FIGURES 7A-7C illustrate example resistive networks for example MTCMOS configurations. In FIGURE 7A-7C, $r_1$ and $r_2$ represent the resistances of logic blocks $C_1$ and $C_2$, respectively, and $R_N$ and $R_P$ represent the resistances of NMOS and PMOS sleep transistors, respectively. In FIGURE 7A, which illustrates a resistive network for a conventional MTCMOS configuration, during the sleep period, two different paths from $V_{DD}$ to ground exist. Since $C_1$ and $C_2$ consist of LVT transistors and sleep transistors are HVT transistors, it may be assumed in particular embodiments that $R_N$, $R_P \gg r_1, r_2$. For purposes of simplification, it may be assumed that $R_N=R_P=R$. The total resistance from the power supply to the ground is thus $R_{total-conv.}=R/2$ and the leakage power consumption may be calculated as follows:

UNITED STATES PATENT AND TRADEMARK OFFICE
CERTIFICATE OF CORRECTION

PATENT NO. : 7,400,175 B2
APPLICATION NO. : 11/755354
DATED : July 15, 2008
INVENTOR(S) : Farzan Fallah et al.

It is certified that error appears in the above-identified patent and that said Letters Patent is hereby corrected as shown below:

$$P_{leakage-conv.} = \frac{2V_{DD}^2}{R} \quad (14)$$

Next, consider the leakage power consumption of the charge-recycling (CR)".

Signed and Sealed this

Thirteenth Day of October, 2009

David J. Kappos
*Director of the United States Patent and Trademark Office*